United States Patent [19]

Brown

[11] Patent Number: 4,480,227

[45] Date of Patent: Oct. 30, 1984

[54] PORTABLE PULSED NMR INSTRUMENT AND METHOD OF USE

[75] Inventor: Robert J. S. Brown, Fullerton, Calif.

[73] Assignee: Chevron Research Company, San Francisco, Calif.

[21] Appl. No.: 508,365

[22] Filed: Jun. 27, 1983

Related U.S. Application Data

[63] Continuation of Ser. No. 255,978, Apr. 15, 1981, abandoned.

[51] Int. Cl.³ ............................................. G01N 27/00
[52] U.S. Cl. ..................................... 324/303; 324/313
[58] Field of Search ............... 324/300, 303, 307, 311, 324/312, 313, 319, 320, 376

[56] References Cited

U.S. PATENT DOCUMENTS

| | | | |
|---|---|---|---|
| 3,302,101 | 1/1967 | Glanville | 324/376 |
| 3,611,118 | 10/1971 | Youngblood | 324/303 |
| 3,617,868 | 11/1971 | Beitel | 324/376 |
| 4,291,271 | 9/1981 | Lauffer | 324/303 |
| 4,296,378 | 10/1981 | King | 324/313 |
| 4,318,043 | 3/1982 | Crooks | 324/309 |
| 4,389,613 | 6/1983 | Brown | 324/312 |
| 4,412,178 | 10/1983 | Brown | 324/303 |
| 4,412,179 | 10/1983 | Brown | 324/312 |

Primary Examiner—Michael J. Tokar
Attorney, Agent, or Firm—Harold D. Messner; Edward J. Keeling

[57] ABSTRACT

In accordance with the present invention, fluid-flow properties of a rock sample based on NMR response of the hydrogen nuclei of interstitial fluids within the pore space of such sample, can be swiftly and accurately achieved using a portable NMR instrument. Inherent instrument inadequacies (DC field inhomogeneity and large phase background jitter) are themselves relied upon to increase the data-throughput efficiency, i.e., the number of NMR responses performed per unit time. Result: Even though the instrument is placed at field sites away from the usual processing center, quick analysis of rock samples as during the drilling of a well, still results. Also, effects of possible echoes during subsequent measurements are prevented by using both the inhomogeneities of the DC field and the essentially random phase spectrum that is inherent in the instrument to average out echoes of prior generated NMR responses.

44 Claims, 4 Drawing Figures

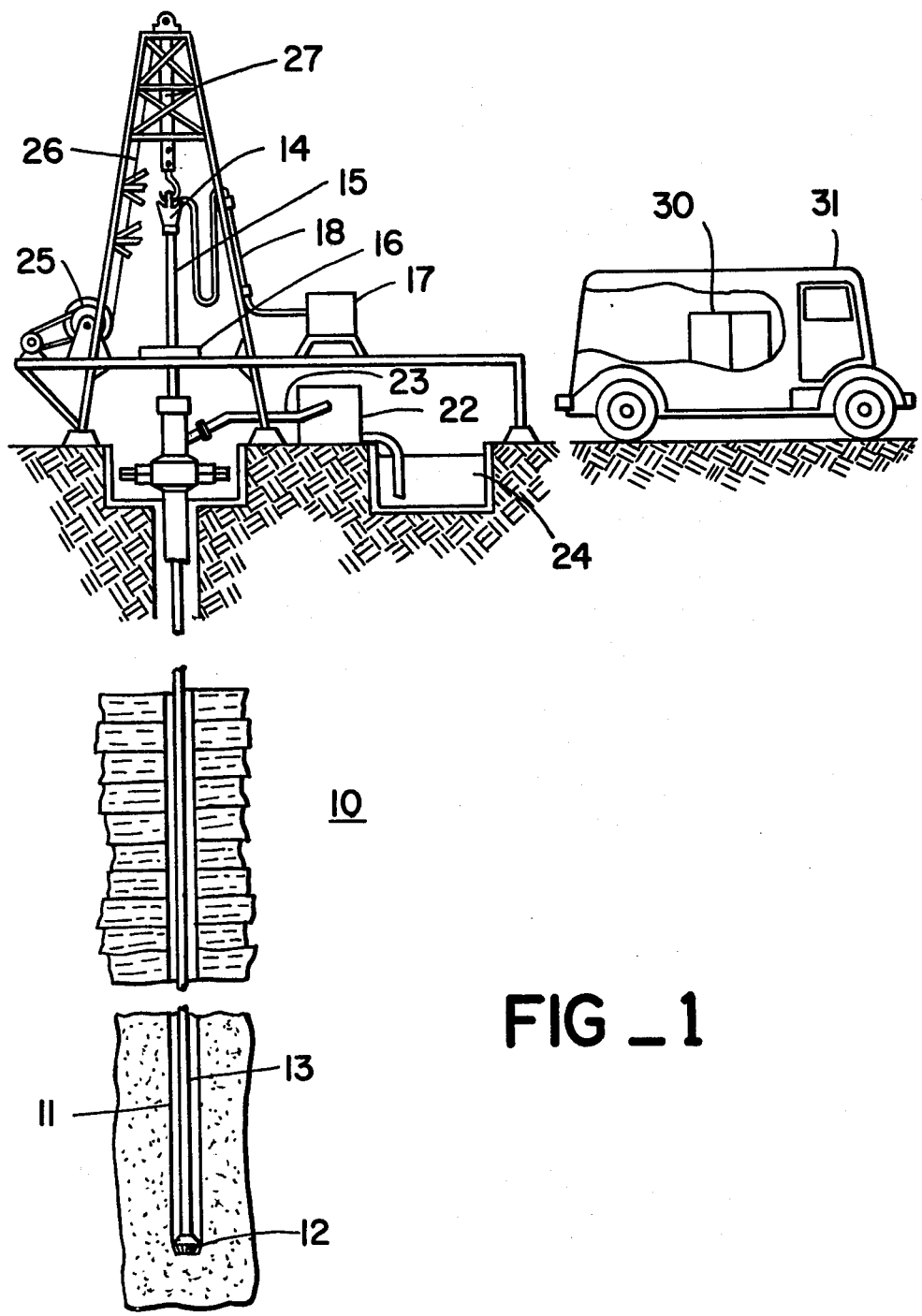
FIG_1

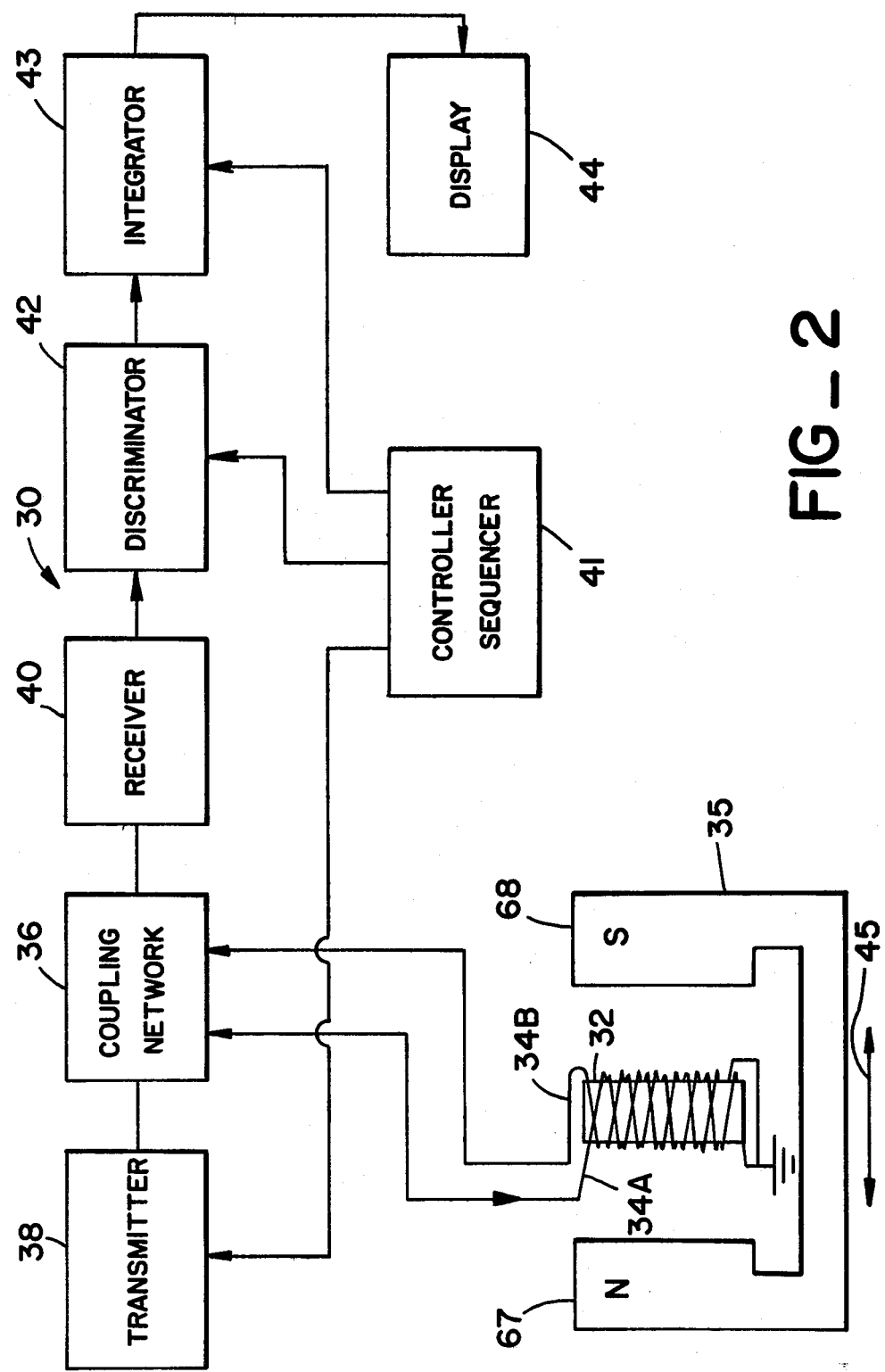
FIG_2

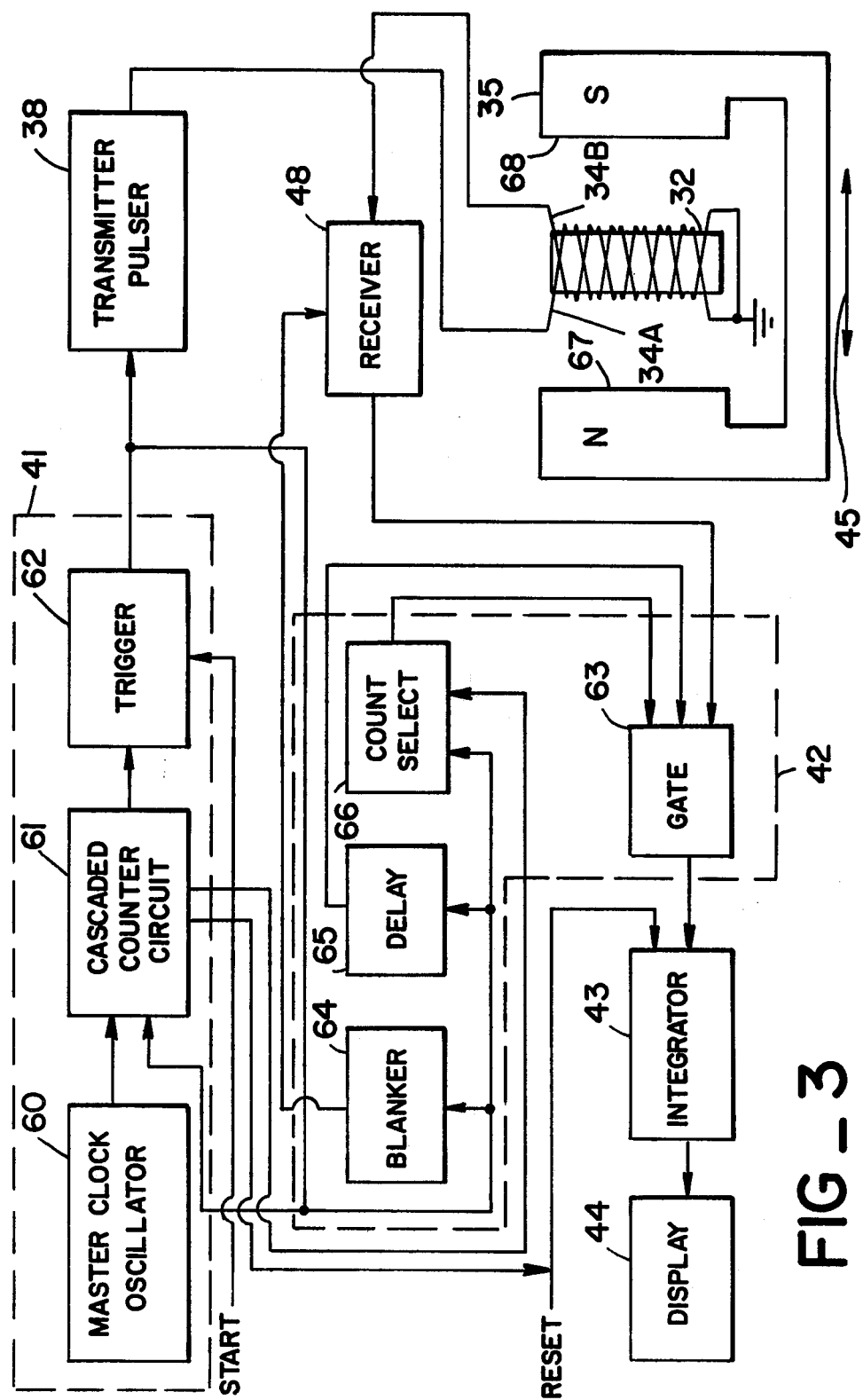
FIG_3

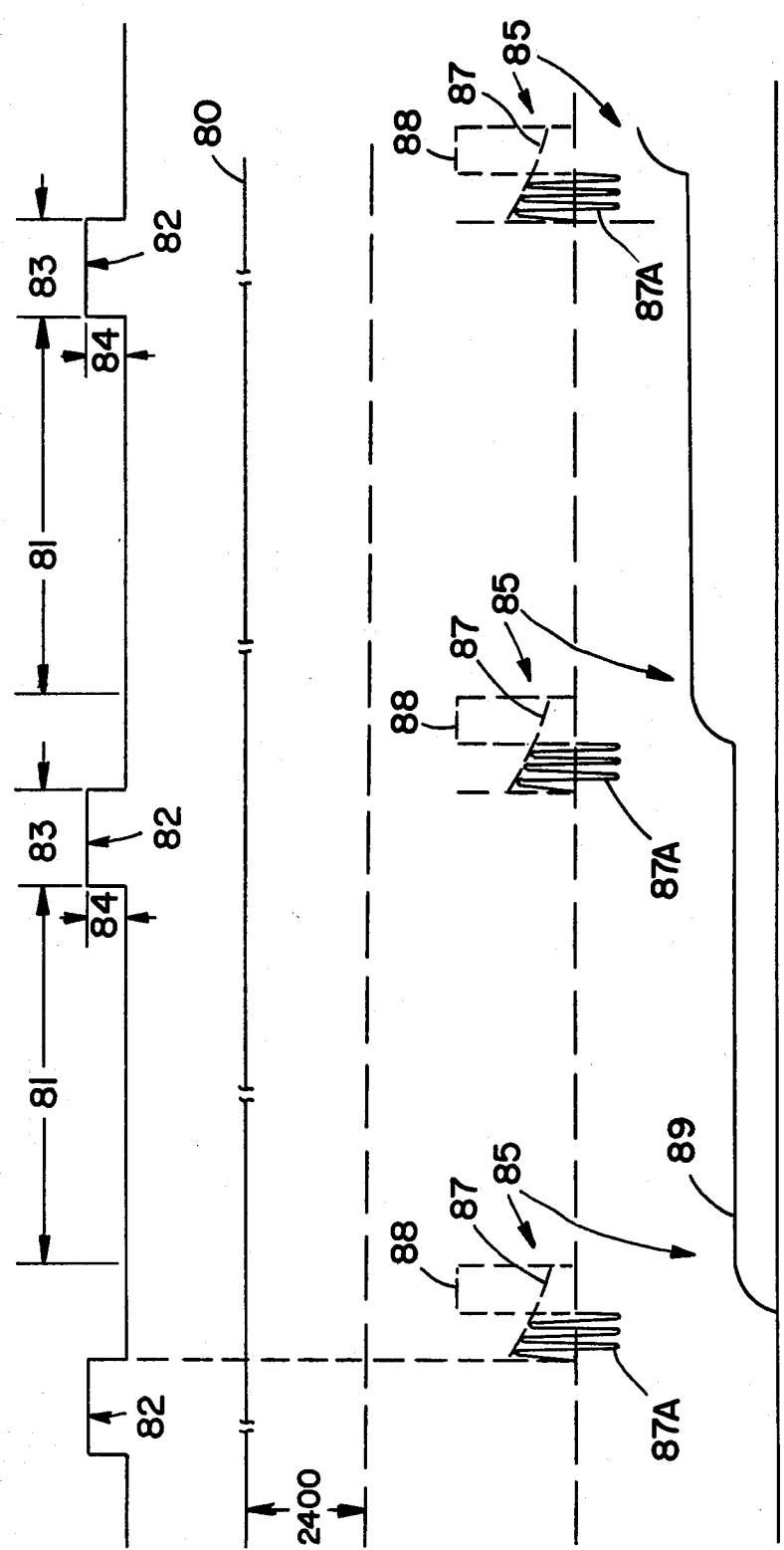
FIG_4

PORTABLE PULSED NMR INSTRUMENT AND METHOD OF USE

This is a continuation of application Ser. No. 255,978, filed Apr. 15, 1981, and now abandoned.

CROSS-REFERENCES TO RELATED APPLICATIONS

My following applications, filed simultaneously herewith, are hereby incorporated herein by reference:

| Serial Number | Title |
|---|---|
| 255,979 | FOR "COMPUTER-CONTROLLED, PORTABLE PULSED NMR INSTRUMENT AND METHOD OF USE" |
| 255,977 | FOR "COMPUTER-CONTROLLED, PORTABLE PULSED NMR INSTRUMENT AND METHOD OF USE WHEREIN THE TIMES OF RF INTERROGATION ARE DISTRIBUTED OVER AT LEAST A CYCLE AT THE NUCLEAR MAGNETIZATION PRECESSIONAL FREQUENCY" |
| 255,975 | FOR "COMPUTER-CONTROLLED, PORTABLE PULSED NMR INSTRUMENT AND METHOD OF USE WHEREIN A DC MAGNETIC FIELD GRADIENT IS ARTIFICIALLY INTRODUCED" |
| 255,976 | FOR "COMPUTER-CONTROLLED, PORTABLE SPIN ECHO NMR INSTRUMENT AND METHOD OF USE" |

SCOPE OF THE INVENTION

This invention relates, in general, to determination of physical properties of samples of porous media using a pulsed NMR instrument, and more particularly to fluid-flow properties of ultrasmall samples of such media as indicated by a small, portable NMR instrument in which the inherent inadequacies of the latter, viz., DC field inhomogeneity and the presence of background phasal incoherence, i.e., circuit jitter, are themselves relied upon to increase instrument flow-through efficiency, i.e., the number of NMR responses provided per unit time. In another aspect, the present invention provides surprisingly quick NMR response data for such samples, each averaged over a series of sequentially applied polarizing periods of substantially equal time spans. Average NMR response time period for maximum polarizing time of 4 seconds: 0.6 seconds. Result: Flow properties of the sample including porosity, permeability and recoverable fluid content can be quickly estimated irrespective of instrument and operator location.

BACKGROUND OF THE INVENTION

Pulsed NMR instruments measuring spin-lattice relaxation time of hydrogen protons of interstitial fluids within samples of porous media are well known but have been principally confined to a laboratory environment. For example, in "Pulsed Nuclear Magnetic Resonance Studies of Porosity, Movable Fluids and Permeability of Sandstones", *Journal of Petroleum Technology*, June 1969, A. Timur indicates flow properties of rock samples can be deduced from NMR responses if measured by a laboratory NMR instrument. In providing such result, the measuring steps also include allowing the nuclei of the interstitial fluid to return to equilibrium each time a response is sought. Then the sample is subjected to a 180° RF pulse before the 90° RF pulse is applied. Total time required per NMR response about 4 seconds.

Although the results obtained by the above laboratory NMR apparatus are and remain impressive (even though less efficiently provided), the fact that the rock samples have to be sent to the laboratory from the field for analysis is a drawback. Reason: The instrument is essentially immovable because of the DC magnet weight requirement for generating the homogeneous DC field of interest. Furthermore, within the oil industry, sophisticated pulsed NMR instruments also require (in addition to large homogeneous DC fields) complex control and pulsing circuitry, such circuitry being required to generate RF magnetic fields along axes parallel as well as perpendicular to the DC field of interest (i.e., requires both the use of 90° and 180° RF fields in successive pairs for realignment and reorion purposes). In this regard, see U.S. Pat. No. 4,166,972 for "NMR Discrimination Apparatus and Method Therefor", J. D. King et al, in which the use of pairs of RF magnetic fields for such purposes are described in detail, in testing environments other than the oil industry.

Circuitry to detect resulting NMR signals can also be extremely complex and costly to manufacture and moreover, in some cases, have been found to be also subject to large background phasal incoherence. Result: In some cases the NMR responses of interest are swamped by the inherent background noise generated by the control and magnetic field generating circuity.

SUMMARY OF THE INVENTION

In accordance with the present invention, fluid-flow properties of rock samples based on NMR response of the hydrogen nuclei of interstitial fluids within the pore space of such samples, can be swiftly and accurately achieved using a portable NMR instrument in which usual inherent inadequacies of the latter (DC field inhomogeneity and large phase background jitter) are themselves relied upon to increase the flow-through efficiency of the instrument, i.e., the number of NMR responses available per unit time. Result: Even though the instrument is placed at field sites away from the usual processing center, quick analysis of rock samples as during the drilling of a well, still results.

In accordance with one aspect of the present invention, inhomogeneities of the DC field can be compensated for by requiring the amplitude of the RF magnetic field (applied to the rock sample for reorientation of the nuclear magnetization) to be greater than the variation in the strength of the DC field over the volume of the sample, yet still be available for elimination of possible NMR response echoes during subsequent measurements. Also of importance in this regard is the fact that the essentially random phase spectrum that is inherent in the instrument of the present invention averages out echoes of prior generated NMR responses, especially those associated with shorter polarizing periods. Result: There is no need for the sample to go through a conventional polarizing cycle to attain a reproducible initial state (in this case, zero polarization). Hence, not only are controller circuit operations simplified (viz., as by simply using a plurality of cascaded counters), but such operations are suprisingly efficient since control pulses for triggering the RF magnetic field can be quite closely spaced, as compared to prior art operations.

DETAILED DESCRIPTION OF THE DRAWINGS

FIG. 1 illustrates a well drilling environment in which a pulsed NMR instrument and method of the present invention has use.

FIG. 2 illustrates in block form the pulsed NMR apparatus of FIG. 1 for testing of ultrasmall samples of a porous earth formation in accordance with the present invention.

FIG. 3 is a further detail of the NMR apparatus of FIG. 1.

FIG. 4 is a timing diagram illustrating the method of the present invention.

DESCRIPTIONS OF PREFERRED EMBODIMENTS

FIG. 1 depicts an environment in which the present invention is particularly useful, viz., in the measurement of fluid-producing potential of an earth formation such as earth formation 10 penetrated by wellbore 11, by determining its fluid-flow properties from NMR responses of chips associated with formation 10. Such chips are produced by a drill bit 12 rotating within the wellbore 11. As shown, drill string 13 attaches to swivel 14 via Kelly bar 15 and rotary drill table 16. As the latter rotates, so does the drill bit 12. Result: Drill chips accummulate at the bottom of the wellbore 13.

In order to bring the rock chips from the bottom of the wellbore 11 as well as to cool the bed 13, conventional drilling technology employs a drilling fluid 14. The fluid 14 continuously circulates in the wellbore 11 after its continuous introduction uphole at the surface of the formation 10.

Formation of the drilling fluid is at a mixer 17. When properly mixed, the fluid passes via line 18, swivel 14, and Kelly bar 15 and thence down drill string 13. After exiting from the drill string 13, the fluid cools the drill bit 12 as well as picks up rock chips at the bottom of the wellbore 11. It next travels up the annulus 20 (between the sidewall 21 of the wellbore 11 and the drill string 13) and exits uphole via line 23 to a Blooie box 22. After various levels of separation have occurred in the box 22, the fluid comes to rest at sump 24. Rock chips previously entrained in the fluid 14 are quickly gathered, and after brief preparation, as explained below, are analyzed at the well site by a pulsed NMR instrument 30 located within truck 31. The purpose of such analysis: to determine the fluid-producing potential of the earth formation 10 in a quick and accurate manner.

Of importance is the annotation of the rock samples with the drilling depth of drill bit 12. Such information can be gathered from a shieve 25 attached to swivel 14 via cable 26 and support bar 27.

It should be apparent that quick evaluation of the fluid-producing potential of the earth formation 10 is exceedingly helpful to the field operator. For example, the operator is interested in quickly determining the following: if the rock samples have the necessary porosity associated with quantities of petroleum; if they have the necessary permeability to permit the fluid contents to flow towards possible producing wells; and whether or not the rock samples contained (in-situ) fluids of interest.

Then decisions can be made at the well site about, e.g., when to change from straight drilling to coring, when to run logs and when to make formation tests without the necessity of time-consuming trips formerly required when samples had to be taken or sent to distant laboratories for NML evaluation.

Attention is now directed to FIG. 2 in which pulsed NMR instrument 30 of the present invention is shown in more detail.

NMR instrument 30 incorporates many usual elements, e.g., a sample holder 32 into which the rock chips are placed. Mechanically, the holder 32 is surrounded by co-extensive and colinear coils 34A and 34B at right angles to a DC field of magnet 35. Electrically, the coils 34A and 34B connect in circuit via coupling network 36 to transmitter 38 and receiver 40, respectively.

Timed operations are determined by controller-sequencer 41. The sequencer 41 generates, inter alia, a series of control signals which causes the transmitter 38 to generate a series of magnetic pulses oscillating at the Larmor frequency for hydrogen nuclei in the DC field of magnet 35. Result: A series of NMR responses associated with the magnetization build-up in the DC field of magnet 35, can be indicated and displayed. The operation of the sequencer 41 is communicated to discriminator 42 and integrator 43 to key their operations as well as that of display 44, as indicated below.

Before discussing operations of instrument 30 of FIG. 2 in more detail, a review of key NMR terminology may be beneficial and is presented below.

Nuclear Magnetization, Dipole Moments Polarization and Relaxation

Hydrogen nuclei of entrained fluids of the rock samples within the holder 32 have magnetic dipole moments which produce magnetic fields somewhat like those of tiny magnets. Were it not for the fact that the moments are within the influence of the DC field of magnet 35, their observable external magnetic field. But since they are subjected to such DC field, their associated magnetic fields become aligned with the DC field, say in direction of arrow 45. At the same time, a scrambling effect due to thermal motion is produced. It tends to prevent such alignment. Result: A slightly preferential alignment in the direction of the arrow 45 (called the "polarization") occurs. Note that the polarization is proportional to the strength of the DC field of magnet 35 that causes the alignment but inversely proportional to absolute temperature, the latter being a measure of thermal motion tended to scramble the system of nuclear magnetic moments.

The nuclear magnetization corresponds to the polarization, and produces a magnetic field which can be detected. Note that the nuclear magnetization does not immediately occur when the DC field is applied nor does it decay immediately when the DC field is removed or vice versa as when the holder 32 (with samples therein) is placed in or removed from the steady-state DC field of magnet 35. The process of the approach of the nuclear magnetization to its new equilibrium value when the magnetic field is changed is called "relaxation" and the corresponding times are called "relaxation times."

Precession

In addition to being little magnets, fluid nuclei within the holder 32, are also like little gyroscopes, and the applied DC magnetic field of the magnet 35 will twist them just as gravity twists a spinning top. Result: The nuclei precess. That is, they precess unless they are aligned with the DC magnetic field just as the toy top precesses so long as it is not aligned with the earth's field of gravity.

Detection of Precession

A precessing nuclear magnetization produces a rotating magnetic field which in turn generates electric signals which can be detected. Precessional frequencies are directly proportional to the strength of the twist causing the precession, that is to say, it is directly proportional to the strength of applied DC magnetic field of the magnet 35, and the precessional frequency is 4.2577 kilohertz per gauss of applied DC field for hydrogen nuclei of interest.

Conditions for Precession

Two things must be present to obtain a precessing nuclear magnetization: First, the magnetization must be produced, by the placement of holder 32 (with sample) in the DC magnetic field provided by magnet 35 for an appropriate length of time. Second, the magnetization and magnetic DC field must somehow be made not parallel to each other as by (i) manipulating the magnetic fields to reorient the nuclear magnetization, or (ii) reorienting the magnetic fields so that the magnetization is subjected to a magnetic field in a new direction.

In nuclear magnetism logging, the concept set forth in item (ii) is used, i.e., proton precession is caused to take place in the earth's field after the nuclear magnetization has been generated in a direction in the borehole perpendicular to the earth's field; when the polarizing field is cut off, the magnetization is left to precess about the earth's field.

In pulsed NMR technology, the opposite is done. The magnetization is first generated by means of the permanent magnet 35 in the direction of arrow 45 and then it is reoriented by means of briefly applied radio-frequency magnetic fields at right angles to the DC field via coil 34A, and then it is allowed to precess about the DC field.

Conditions for RF Reorientation of the Magnetization

A convenient way to visualize reorientation of the nuclear magnetization associated with the hydrogen nuclei within the holder 32 is via the analogous use of a rotating frame of reference.

It can be shown mathematically and is plausible intuitively that assuming a reference frame rotating with the same frequency as that of the RF magnetic field applied via coil 34A to cause precession, then in the rotating frame the reorientation of the nuclear magnetization occurs as if certain magnetic fields were cancelled. If additional fields are present (other than those apparently cancelled), then it may be easy to visualize their effect.

As a simple example, assume that a reference frame rotates at exactly the precessional frequency of the nuclear magnetization in the DC field of the permanent magnet 35. Then in the rotating frame the magnetization is apparently not subject to the action of any magnetic field at all. As the oscillating RF field (via coil 34A) is applied exactly at the precessional frequency of the hydrogen nuclei (again, being exactly the frequency with which the reference frame rotates), the oscillating RF field, in effect, consists of two rotating fields. Each has half the amplitude of the oscillating field and rotates in opposite directions. Result: Their components perpendicular to the oscillating field cancel, while their components parallel to the oscillating field add so that each equal to half the oscillating field. One of these rotating fields appears to stand still, that is, the one that is rotating the same way as is the reference frame, and causes a steady precession of the nuclear magnetization about it. But, the one rotating the other way now appears to rotate twice as fast, and alternates directions so rapidly that is has no effect.

Quantitative Example

Consider that 20 gauss is the strength of the RF field applied via the coil 34A at right angles to the DC field of magnet 35. Thus, the strength of a rotating component is 10 gauss. Consider also that the DC field of the magnet 35 (about 2400 gauss) is absent in the rotating frame of reference leaving what appears to be a static field of 10 gauss (plus another 10 gauss field rotating so fast it is ineffectual), acting in the direction of arrow 45. The nuclear magnetization precesses about the 10 gauss field (turns about this field as an axis) at a frequency of 42577 hertz (10 gauss×4257.7 hertz per gauss) corresponding to a period of 23.5 microseconds.

If the RF field is applied for 23.5 microseconds, the magnetization would have precessed one full cycle, and would be oriented just as it was before application of the RF field by the coil 34A. However, suppose the RF pulse of the coil 34A is supplied just under 6 microseconds. Then, the magnetization initially parallel to the DC field, precesses about a quarter cycle (90° in the rotating frame end), leaving the magnetization at right angles to the strong DC field. Since it is at right angles when the RF pulse terminates, conditions necessary for magnetization precession exists. Result: An NMR response is established. Such responses can be averaged over series of polarizing times, provided there is rapid coordination of operations between controller-sequencer 41 and discriminator 42. While at the same time, care must be taken to overcome the twin problems of DC field homogeneity and phase incoherency inherent in rapid NMR measurements.

FIG. 3 illustrates operation of controller-sequencer 41 and discriminator 42 in more detail.

As shown, controller-sequencer 41 includes a master clock 60 for controlling operations of transmitter-pulser 38 via cascaded counter circuit 61 and trigger circuit 62. Counter circuit 61 is usually functionally interconnected in groups at a series of different operational levels, to key operations, the number of counters being matched to the number of different repetitions (i.e., polarizing periods) required during each measuring cycle. For example, assume four series of polarizing periods are to be used and say these polarizing periods are 10, 20, 30 and 40 milliseconds respectfully. Since the RF magnetic pulse width is essentially constant (about equal to 4.5 microseconds), the time span between such series of pulses would be equal to the aforementioned 10, 20, 30 or 40 milliseconds.

Assume also that each polarizing period is to be repeated 20 times. That is to say, each NMR response of a respective 10, 20, 30 or 40 millisecond polarizing period, is to be repeated 20 times before the next operational level occurs. Thus, the cascaded circuit 61 would consist essentially of four sets of counters in which each set consists of a pair of counters that together track two variables: (1) time increments within the preset polarizing periods of 10, 20, 30 or 40 milliseconds, and (2) the iterative number of polarizing periods within the maximum allowed 20 NMR periods needed per measuring cycle. Result: The series of magnetization build-ups (due to the DC magnetization field of magnet 35 acting on the hydrogen nuclei within the holder 32) can be counted, and the associated NMR responses can be recorded in a highly accurate manner. For example, when the counts of the counter circuit 61 match a count setting at a particular operational level, the second of the counters decrements its pre-existing count setting by ONE; resets the first counter to zero while simultaneously activating the transmitter-pulser 38 via trigger 62; and then after a preset time delay (to allow for NMR response measurements as explained below) the counters 61 iterate to allow the process to be repeated and then re-repeated until the decremented count at the second counter has reached a zero count value. Then at that occurrence (that is, at the occurrence of the 20-in-20th measuring increment), a flipflop (not shown) can be triggered to initiate operations of the next level of the operations whereby the NMR responses of the samples associated with a different magnetization period of say, 20, 30 or 40 milliseconds, are rapidly provided. The process continues until the lowest level of the cycle is reached at which time operations terminate.

It should be noted that during the aforementioned delay in operations of the counter circuit 61, the built-up magnetization of the nuclei is reoriented via activation of the transmitter-pulser 38 through trigger circuit 62 and coil 34A. Then the coil 34B detects precession of the magnetization about an axis parallel to arrow 45. Since the receiver 40 connected to coil 34B preferably includes diode rectification subcircuitry, the receiver output is the envelope of the positive peaks of the precessional signals, not their absolute values. Note in this regard that coils 34A and 34B are co-extensive and hence interactive. When cylindrical coil 34A radiates RF pulses, such pulses are also detectable at coil 34B and receiver 40. Hence, a need for blanker circuit 64, connected to receiver 40, exists. Blanker circuit 64 is usually a series of flipflops, which cooperatively function to "blank off" the receiver 40 as the transmitter-pulser 38 is activated.

Further refinements in the timing of operations can be provided by delay circuit 65 and count circuit 66. Even though signal outputs from the delay and count circuits 65, 66 are not synchronous, gate 63 can provide a synchronizing function. Result: generation of a particular and repetitive time window over which the amplitude magnetization per unit time can be measured. Although the time frame of the window is constant within the measuring cycle, it can be lengthened (time-shifted) as desired. Based on the operation of the transmitter 38, the delay circuit 65 controls the zero-crossing at which the time window opens (after the transmitter-pulser 38 has been activated) while the count circuit 66 controls the width of the window as measured from the up-tick from zero-crossing of the pulser output. Result: The magnetization build-up over the time window can be properly gated to an integrator 43 where amplitude accummulation over the repeated measuring cycle occurs. That is to say, the amplitude per window increment is accummulated at the integrator 43 for the entire 20 NMR measuring periods. Then as dictated by a change in operational level within the cascaded counter circuit 61, the integrator 43 is reset to zero, and a new measuring cycle begins.

Display 44 continuously monitors the integrated output of the integrator 43 and visually displays the results. The display 44 can be a digital volt meter (DVM), so as in effect, the integrated response from integrator 43 is normalized to an average value over the 20 NMR polarizing periods that the NMR response is monitored.

In order to further understand the complexity of providing a series of polarizing periods intermixed with a plurality of RF field pulses, the effects of inhomogeneous DC fields and background phase jitter on NMR response, must be described.

Both the DC magnetic and the RF fields are inhomogeneous in space. That is, not all of the nuclei within the holder 32 experience the same DC field or the same RF field. Result: Even if the RF frequency is correctly tuned so that the DC field is exactly cancelled for one point in the sample volume, there will be other nuclei in the sample where the DC field is undercancelled or overcancelled. That is to say, if the volume in the sample in holder 32 is large compared to the DC field variation, the sample volume will experience different DC fields from part-to-part within the volume, resulting in under- or over-cancelled DC field components in the rotating frame of reference with an associated variation in the rate of precession.

Note in FIGS. 2 and 3 that the width of the pole faces 67 and 68 extend beyond the holder 32. Also note that the volume of holder 32 of the present invention is very small ($\pi \times$ the diameter $\times$ the length of the sample) compared to the inhomogeneity estimate D of the DC field.

After termination of the RF pulse, effects of DC inhomogeneity linger on, however, especially related to the precession of the nuclear magnetization. But in accordance with the present invention, the above condition does not depreciate results but becomes a necessary variable in the correct operation of the entire system.

In more detail, during polarization by the DC field, the build-up magnetization being a vector quantity can be resolved into components parallel to and perpendicular to the DC field. The component parallel to the DC field does not precess because the component is not twisted, since precessional amplitude is proportional to the angle between the DC field and the dipole moment. But since the slight inhomogeneity of the DC field has no effect on the parallel component of the magnetization, such component (and the nuclei associated therewith) are ready for the onset of the next polarization period. That is to say, only a sequence of 90° RF magnetic pulses via transmitter-pulser 38 under control of the sequencer-controller 41 is required for satisfactory operations of the present invention. Other components parallel to the DC field, in effect, erase their past magnetic history as to magnetic direction. Result: A series of NMR responses can be quickly and accurately detected over a short period of time.

Note further that the inhomogeneity of the DC field (as provided by magnet 35 and as compensated by controlling the amplitude of the RF interrogation pulses), aids in eliminating response "echoes" during subsequent magnetization build-ups. This is because the slight inhomogeneity of the DC field causes the nuclei to experience slightly different DC fields (from part-to-part within the sample volume). Ultimately, each such part (after interrogation) rotates at a slightly different rate of precession.

In accordance with the present invention, accumulated effects of refocusing ("echoes") for shorter time magnetization build-ups is likewise minimized by randomly changing the starting point of each measuring sequence. That is, the start position of the angular phase of the perpendicular component of magnetization is changed in a random manner due to the background phase jitter inherent in the generation of the RF interrogation pulses. Result: Even though the perpendicular component may be of constant amplitude and constant frequency of precession, its initial start point occurs at a different phase angle each measuring cycle, due in large part, to the circuit characteristics and performance of the controller-sequencer 41.

FIG. 4 illustrates the operations of controller-sequencer 41 in signal waveform fashion.

As shown, the numeral 80 identifies the signal waveform of the DC magnetic field as provided by magnet 35. Note that the field, continuously applied to the sample over a measurable polarizing interval 81 (for providing magnetization build-up to the hydrogen nuclei). Note further that the interval 81 terminates with the onset of RF pulses 82 generated by transmitter-pulser 38. Each pulse 82 oscillates at the Larmor frequency of hydrogen nuclei and randomly begins within a particular cycle based on the random phase spectrum of the sequencer-controller 41. Each polarizing interval 81 provides for build-up of the magnetization in the manner previously described so that relaxation characteristics can be established.

In this regard, width 83 and amplitude 84 of each pulse 82 must be sufficient to achieve component resolution of the magnetization as previously described. In this regard, it should be noted that the amplitude 84 and width 83 are interrelated in that they must effect reorientation of the magnetization components as previously described for precession about the DC field. In this regard, the product of amplitude and pulse width should be equal to approximately $\pi/\gamma \times Z$ where $\gamma$ is the magnetogyric ratio and Z is a number between 0.1 and 20 but preferably about $\frac{1}{2}$.

Of course, the purpose of the RF pulses 82 is to serialize operations whereby a plurality of NMR responses generally indicated at 85 can be indicated. Responses 85 are first seen as signals 87 associated with receiver 40, and next seen as signals 89 associated with integrator 43, and can be ultimately indicated as an accumulative digital display, normalized as previously indicated at display 44.

Signals 89 result from positive rectification of the decaying precessional signals 87 over time window 88. Signals 87, of course, represent the envelope that intersects the positive peaks of the signal 87A as a function of time and is indicative of the absolute magnetization strength. Signals 89 thus can represent feedback operations of an operational amplifier incrementally charging a capacitor to a peak amount proportional to the integrated rectified voltage produced during signal gates at the receiver 40. Only after the repetitive measuring cycle has been completed, say 20 repetitions, does the capacitor become discharged (discharged for the beginning of the next cycle.

Display 44 preferably is a digital volt meter (DVM) and includes a 7-segment decoder-driver in series with the plurality of LED's. It provides a digital readout of the signal 89 as a function of time. The display is preferred normalized by dividing the total display count by the number of measuring repetitions. The final normalized count can be held for display as long as required, usually until a reset signal (see FIG. 3) is received from the sequencer-controller 41 to initiate a new cycle. During that period, a camera (not shown) can be used to record the display, if desired.

One skilled in the art should realize that as little as two separate NMR responses can define a relaxation curve for the hydrogen nuclei undergoing examination, although more sophisticated techniques are available, see for example, Timur, previously cited. What is usually provided is a quantity which is proportional to the difference in nuclear magnetization at finite times from the equilibrium, say at least two normalized instances of time. Whether or not the magnetization being measured is building up to an equilibrium value or is dying down from the equilibrium value makes little difference. It is the difference or distance from equilibrium that can be plotted for any relaxation plot desired.

Sample Preparation

Rock samples obtained in the manner depicted in FIG. 1 or mechanically extracted from a core cut from the earth during drilling, are cleansed as discussed below.

If the samples have no visible oil traces in their outer surfaces, simple immersion in a 1% NaCl aqueous solution is usually sufficient. Removal of air (from within their pores) may be helpful, as done by a conventional air evacuation system. Cleansed samples (after pat drying) are inserted to a depth of about 6 mm within coil 34A. Sample volume is a little over 0.3 cubic cm. However, since the chips are irregular in shape, they may occupy only about half the space.

If the samples have some oil at their outer surfaces (a common occurrence if they come from a formation penetrated by a well whose circulating fluid was an oil-base drilling mud or if the sample is from an oil-containing zone), cleaning can be a bit more difficult. But applying conventional dry cleaning fluids to the oil "stains" seems to solve the problem. Then saline immersion, followed by air evacuation and pat drying, provide adequately cleansed samples for testing in accordance with the present invention.

Conclusion

In accordance with the present invention, a series of NMR measurements provides indications of flow properties of the associated rock samples. Although analysis is not simple (because if the porous rock contains water, the water acts as a "catalyst", speeding up both the magnetization build-up and relaxation reactions), the present invention provides surprisingly accurate results under such circumstances. For instance, for shale, a time of a few milliseconds is enough for the build-up of the magnetization to a maximum value. From moderately clean sandstones of substantial permeability, the time for magnetization build-up may be of the order of a second.

In accordance with the present invention, to recapitulate, the basic idea is: For a given porosity and free-fluid content, the longer—timewise—the magnetization takes to build up within the sample, the larger its volume-to-surface ratio, the larger its flow channels and hence, the larger its permeability.

While permeability expressions have been previously developed and are quite good, such expressions are usually reserved for relaxation times over 12 milliseconds. In order to give a more general expression, the following equations have been empirically developed based on rock types from various oil-producing regions of the U.S.A., viz., the Gulf Coast, the West Coast and the Rocky Mountain region.

$$\log_{10}(pern) = 5\log_{10}(\phi/10) + \log_{10}(F_{20}) + 0.9(F_{20} + F_{80}) \quad (1)$$

where $\phi$ is the porosity in percent, calculated as described below, and $F_t = (S_\infty^* - S_t^*)/S_\infty^*$, where $S_t^*$ is the signal, corrected for noise, and t is the polarizing time, in milliseconds.

If (1) in logarithmic form is not needed, another form is available:

$$pern = (\phi/10)^5 F_{20} 10^{0.9(F_{20} + F_{80})} \quad (1\text{-}a)$$

If means of computing exponentials to the natural base, e, is available, another form can be used, to wit:

$$pern = (\phi/10)^5 F_{20} exp[2(F_{20} + F_{80})] \quad (1\text{-}b)$$

Of course, if the sample cores are available, the above equations can be further altered in light of data observable from testing of such cores. In that way, new permeability formulas can be especially developed for specific geologic situations.

Likewise, porosity is the ratio of pore volume to total rock volume including pore volume, or $$\text{porosity} = \phi = \frac{\text{pore volume}}{\text{pore volume} + \text{solid volume}} \quad (2)$$

Pore volume is proportional to $S_\infty^*$. If brine is added to the sample containing the brine-saturated rock to bring the level up to some standard mark, and a reading is taken with sufficiently long polarizing time to get the maximum value, a reading, $S_{r+b}$, sufficiently large that the correction for noise can be omitted, is obtained. Here, "r" stands for "rock", and "b" stands for "brine". Likewise, if an identical sample tube is filled with only brine (to an identical mark), a reading, $S_b$, which is also large enough so that the noise correction can be omitted, is also obtained. The difference between these two readings, $S_b - S_{r+b}$ indicates the pore space of the sample has brine everywhere except in the region occupied by the solid material of the sample. Thus, porosity can be indicated, as follows:

$$\text{porosity} = \phi = \frac{(S_\infty)}{[S_\infty^* + (S_b - S_{r+b})]} \quad (3)$$

When the sample is associated with a well drilled with an oil-based drilling mud or is taken from an oil zone, the pores of the sample must be cleansed of oil and reconstituted with brine, before measurements can occur, starting with a kerosene bath, followed by a pair of naphtha baths, a bath of 50% acetone and ending with two acetone baths in succession. After the chips are dried, they are injected with brine using vacuum-induced saturation in which the chips immersed in brine in effect allow the brine to be drawn within their pores as they undergo evacuation.

It should be noted that as the magnetization build-up interval increases from very small values to very large values, the signal increases until the interval is of the order of 6 relaxation times after which further increases do not lead to increases in response. For instance, the NMR responses found in the interval build-up of 100, 200, 300 and 400 milliseconds of a particular sandstones sample, have been studied. Signals provided for build-up of 100 milliseconds are only slightly smaller than the others. The above value, corrected for noise, is proportional to the amount of hydrogen within the pore space of the sample, and is directly related to porosity. (It's usually called the "NMR infinite response" of the sample.) Resulting signal differences multiplied by a convenient constant can be plotted on semi-log graph paper to produce the relaxation curve previously described, i.e., R relaxation (T) is equal to $S_f \div S_\infty = 1 - S_t \div S_\infty$.

All specific embodiments of the invention have been described in detail, and it should be understood that the invention is not limited thereto as many variations will be readily apparent to those skilled in the art. Thus, the invention is to be given the broadest possible interpretation within the terms of the following claims.

I claim:

1. Apparatus for swiftly determining fluid-flow properties of a rock sample based on NMR response of hydrogen nuclei of interstitial fluids within pore spaces of said sample in which DC field inhomogeneity and phase background jitter are used to increase data-throughput efficiency (DTE) comprising:
   (a) magnet means for producing a DC magnetic field acting on said rock sample, said magnetic field having an intensity of at least 1 kilogauss and an inhomogeneity of at least D gauss over said sample to provide a series of nuclear magnetization build-ups associated with said interstitial fluids within said sample as a function of time;
   (b) RF coil means acting at right angles to said DC magnetic field;
   (c) transmitter means including control means connected to said RF coil means to produce a series of orthogonal RF magnetic field pulses of specified frequency, amplitude and duration, for interrogating said sample, said amplitude being at least greater than the variation D in said DC field over said sample;
   (d) receiver means connected to said RF coil means for forming at least an output signal proportional to said nuclear magnetic resonance response of said interstitial fluids;
   (e) said transmitter means including control means having a phasal background jitter characteristic associated therewith that randomly varies with time so that said sample can be repetitively interrogated to serially indicate nuclear magnetization relaxation without need for applying rescrambling reversing RF magnetic field pulses prior to the start of each magnetization build-up cycle.

2. The apparatus of claim 1 wherein said control means associated with said transmitter means causes the rate of repetition of said transmitter means to change between at least two series of selected values whereby fluid-flow properties of said sample can be determined.

3. The apparatus of claim 2 wherein said receiver means is connected to a discriminator circuit in series with an integrator circuit.

4. The apparatus of claim 3 wherein said integrator circuit integrates said NMR responses over a plurality of time intervals to obtain improved signals representing nuclear magnetization relaxation in said DC magnetic field within an average time interval between application of said RF magnetic interrogation fields.

5. The apparatus of claim 4 wherein said integrator circuit is connected to a display means.

6. The apparatus of claim 5 wherein said display means includes a 7-segment decoder-driver in series with a plurality of LED's, wherein the final display is preferably normalized by dividing the total display count by the number of measuring cycles occurring during interrogation of said sample.

7. The apparatus of claim 1 wherein the inhomogeneity of the DC magnetic means aids in preventing refocusing of prior generated NMR signals during subsequent magnetization build-ups, especially at long polarizing periods.

8. A method for swiftly determining fluid-flow properties of a rock sample based on NMR response of hydrogen nuclei of interstitial fluids within said sample in which DC field inhomogeneity and phasal background jitter are used to increase data-throughput efficiency (DTE) comprising:
(a) placing the rock sample in a steady DC magnetic field having a strength of at least 1 kilogauss and an inhomogeneity of at least D gauss over said sample to provide a series of nuclear magnetization build-ups associated with said interstitial fluids;
(b) subjecting said sample to interrogation by a series of RF magnetic field pulses having in addition to selected frequency, duration and magnitude values, a phasal background jitter characteristic that is random with time, to cause reorientation of each of said series of built-up magnetizations, the magnitude of each of said pulses being greater than the variation D in strength in said DC field over said sample; and
(c) detecting after interrogation a plurality of nuclear magnetic resonance (NMR) signals indicative of nuclear magnetization relaxation, each of said NMR signals occurring between pulses of said RF magnetic field without need for application of reversing RF field pulses prior to the start of each magnetization build-up cycle.

9. Method of claim 8 in which the steps involving (i) application of said series of RF interrogation pulses and (ii) detection of NMR signals indicative of nuclear magnetization relaxation as a function of time without need for applying reversing RF pulses, are due to said DC field inhomogeneity of step (a) preventing refocusing of NMR signal echoes during subsequent measuring intervals.

10. Method of claim 8 in which the steps involving (i) application of said series of RF interrogation pulses and (ii) detection of NMR signals indicative of nuclear magnetization relaxation as a function of time without need for applying reversing RF pulses, are due to said phasal background jitter characteristic of step (b) preventing refocusing of NMR echoes during subsequent measuring intervals.

11. Method of claim 8 in which the steps involving (i) application of said series of RF interrogation pulses and (ii) detection of NMR signals indicative of nuclear magnetization relaxation as a function of time without need for applying reversing RF pulses are due to both DC field inhomogeneity of step (a), and said phasal background jitter characteristic of step (b), thereby preventing refocusing of NMR echoes during subsequent measuring intervals.

12. Method of claim 8 in which the steps involving (i) subjecting said sample to a series of RF pulses and (ii) detecting a plurality of NMR signals indicative of nuclear magnetization relaxation as a function of time, is further characterized by exposing said sample to said DC magnetic field for a specified series of constant time intervals and thereafter altering the duration of said time intervals to other values forming a sub-series thereof, whereby fluid-flow properties of said sample can be determined.

13. Method of claim 8 in which each of said series of RF pulses interrogating said sample is characterized by the product of its pulse width and amplitude being equal to $\pi/\gamma \times Z$ where $\gamma$ is the magnetogyric ratio and Z is any number.

14. The method of claim 13 in which Z is between 0.1 and 20.

15. The method of claim 13 in which Z is about $\frac{1}{2}$.

16. Method of claim 12 in which the steps involving exposing the sample to said DC field is for at least two different series and sub-series of time intervals, followed by the step of analyzing relative rates of magnetization relaxation as a function of time to thereby indicate fluid-flow properties of said sample.

17. The method of claim 16 in which one of the fluid-flow properties analyzed for is permeability.

18. Method of claim 12 in which the steps involving exposing the sample to said DC field is for two at least different series and sub-series of time intervals, followed by the step of analyzing relative amplitudes of magnetization relaxation as a function of time to thereby indicate a fluid-flow property of said sample.

19. The method of claim 18 in which the fluid-flow property analyzed for is porosity.

20. The method of claim 16 in which the fluid-flow property analyzed for is irreducible water saturation.

21. Method of aiding in the drilling of a wellbore penetrating an earth formation wherein chips produced by a drilling bit attached to drill string are swiftly analyzed to indicate fluid-flow properties of said formation based on NMR response of hydrogen nuclei of interstitial fluid within said chips, comprising:
(a) gathering chips for purposes of NMR analysis as a function of drill bit depth, while the drill bit and drill string are within the wellbore;
(b) adjacent the drill site, while the drill bit and drill string remain within the wellbore, placing at least a portion of the chips in a steady DC magnetic field having a strength of at least 1 kilogauss and an inhomogeneity of at least D gauss over said sample to provide a series of nuclear magnetization build-ups associated with said interstitial fluids;
(c) subjecting said portion of the chips to interrogation by a series of RF magnetic field pulses having selected frequency, duration and magnitude values, to cause reorientation of each of said series of built-up magnetizations, the magnitude of each of said pulses being greater than the variation D in strength in said DC field over said sample; and
(d) detecting after interrogation a plurality of nuclear magnetic resonance (NMR) signals indicative of nuclear magnetization relaxation, each of said NMR signals occurring between pulses of said RF magnetic field, said relaxation being indicative of fluid-flow properties of said formation whereby operations associated with said wellbore are aided.

22. The method of claim 21 in which said nuclear magnetization relaxation of step (d) is used to determine if straight drilling operations to coring operations are in order.

23. The method of claim 21 in which said nuclear magnetization relaxation of step (d) is used to determine if pulling of the drill bit and string followed by logging of the wellbore are in order.

24. The method of claim 21 in which the nuclear magnetization relaxation of step (d) is used to determine if formation testing is in order.

25. Method of claim 21 in which the steps involving (i) application of said series of RF interrogation pulses, and (ii) detection of NMR signals indicative of nuclear magnetization relaxation as a function of time are aided by said DC field inhomogeneity of step (b) preventing refocusing of NMR signal echoes during subsequent measuring intervals.

26. Method of claim 21 in which the steps involving (i) subjecting said portion of the chips to a series of RF pulses and (ii) detecting a plurality of NMR signals indicative of nuclear magnetization relaxation as a function of time, is further characterized by exposing said portion of the chips to said DC magnetic field for a specified series of constant time intervals and thereafter altering the duration of said time intervals to other values forming a sub-series thereof, whereby fluid-flow properties of said earth formation can be determined.

27. Method of claim 21 in which each of said series of RF pulses interrogating said portion of the chips is characterized by the product of its pulse width and amplitude being equal to $\pi/\gamma \times Z$ where $\gamma$ is the magnetogyric ratio and $Z$ is any number.

28. The method of claim 27 in which $Z$ is between 0.1 and 20.

29. The method of claim 27 in which $Z$ is about $\frac{1}{2}$.

30. Method of claim 26 in which the steps involving exposing said portion of the chips to said DC field for two different series and sub-series of time intervals, are followed by the step of analyzing relative rates of magnetization relaxation as a function of time to thereby indicate fluid-flow properties of said formation.

31. The method of claim 30 in which one of the fluid-flow properties analyzed for is permeability.

32. Method of claim 26 in which the steps involving exposing said portion of the chips in said DC field for two different series and sub-series of time intervals, are followed by the step of analyzing relative amplitudes of magnetization relaxation as a function of time to thereby indicate a fluid-flow property of said earth formation.

33. The method of claim 32 in which the fluid-flow property analyzed for is porosity.

34. The method of claim 30 in which the fluid-flow property analyzed for is irreducible water saturation.

35. Method of swiftly determining fluid-flow properties of a rock sample obtained from an earth formation penetrated by well based NMR response of hydrogen nuclei of interstitial fluids within pore spaces of said sample, comprising:

(a) gathering said sample of said earth formation as a function of depth of said well;

(b) adjacent the well site, placing the sample in a steady DC magnetic field having a strength of at least 1 kilogauss and an inhomogeneity of at least D gauss over said sample to provide a series of nuclear magnetization build-ups associated with said interstitial fluids;

(c) subjecting said sample to interrogation by a series of RF magnetic field pulses having selected frequency, duration and magnitude values, to cause reorientation of each of said series of built-up magnetizations, the magnitude of each of said pulses being greater than the variation D in strength in said DC field over said sample; and (d) detecting after interrogation a plurality of nuclear magnetic resonance (NMR) signals indicative of nuclear magnetization relaxation, each of said NMR signals occurring between pulses of said RF magnetic field, said relaxation being indicative of fluid-flow properties of said formation whereby operations associated with said well are aided.

36. Method of claim 35 in which the steps involving (i) application of said series of RF interrogation pulses and (ii) detection of NMR signals indicative of nuclear magnetization relaxation as a function of time are aided by said DC field inhomogeneity of step (b) preventing refocusing of NMR signal echoes during subsequent measuring intervals.

37. Method of claim 35 in which the steps involving (i) subjecting said sample to a series of RF pulses and (ii) detecting a plurality of NMR signals indicative of nuclear magnetization relaxation as a function of time, is further characterized by exposing said sample to said DC magnetic field for a specified series of constant time intervals and thereafter altering the duration of said time intervals to other values forming a sub-series thereof, whereby fluid-flow properties of said sample can be determined.

38. Method of claim 35 in which each of said series of RF pulses interrogating said sample is characterized by the product of its pulse width and amplitude being equal to $\pi/\gamma \times Z$ where $\gamma$ is the magnetogyric ratio and $Z$ is any number.

39. The method of claim 38 in which $Z$ is about $\frac{1}{2}$.

40. Method of claim 37 in which the steps involving exposing the sample to said DC field is for at least two different series and sub-series of time intervals, followed by the step of analyzing relative rates of magnetization relaxation as a function of time to thereby indicate fluid-flow properties of said sample.

41. The method of claim 40 in which one of the fluid-flow properties analyzed for is permeability.

42. Method of claim 37 in which the steps involving exposing the sample of said DC field is for at least two different series and sub-series of time invervals, followed by the step of analyzing relative amplitudes of magnetization relaxation as a function of time to thereby indicate a fluid-flow property of said sample.

43. The method of claim 42 in which the fluid-flow property analyzed for is porosity.

44. The method of claim 42 in which the fluid-flow property analyzed for is irreducible water saturation.

* * * * *